United States Patent
Han et al.

(10) Patent No.: US 6,881,637 B2
(45) Date of Patent: Apr. 19, 2005

(54) METHOD OF FORMING A GATE ELECTRODE, METHOD OF MANUFACTURING A SEMICONDUCTOR DEVICE HAVING THE GATE ELECTRODE, AND METHOD OF OXIDIZING A SUBSTRATE

(75) Inventors: Jae-Jong Han, Seoul (KR); Yong-Woo Hyung, Gyeonggi-do (KR); Seung-Mok Shin, Gyeonggi-do (KR); Kong-Soo Lee, Gyeonggi-do (KR); Eun-Jung Yun, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/672,884

(22) Filed: Sep. 26, 2003

(65) Prior Publication Data

US 2004/0092090 A1 May 13, 2004

(30) Foreign Application Priority Data

Oct. 31, 2002 (KR) ................................ 10-2002-0066804

(51) Int. Cl.[7] ............................................. H01L 21/336
(52) U.S. Cl. ....................... 438/303; 438/595; 438/655; 438/656; 438/660; 438/663; 438/682
(58) Field of Search .................................. 438/299, 303, 438/595, 655, 656, 660, 663, 682

(56) References Cited

FOREIGN PATENT DOCUMENTS

| JP | 8032066 | 2/1996 |
|---|---|---|
| JP | 11345970 | 12/1999 |
| KR | 000061321 A | 10/2000 |

OTHER PUBLICATIONS

English language of Abstract for Japanese Patent Publication No. JP8032066, filed Feb. 2, 1996.
English language of Abstract for Japanese Patent Publication No. JP11345970, filed Dec. 14, 1999.
English Language Abstract of Korean Publication No: 000061321 A.

*Primary Examiner*—Hsien-Ming Lee
(74) *Attorney, Agent, or Firm*—Marger Johnson & McCollom, P.C.

(57) ABSTRACT

In a method for forming a gate electrode having an excellent sidewall profile, after a gate structure is formed on a substrate, a first oxide film is formed on a sidewall of the gate structure and on the substrate by re-oxidizing the gate structure and the substrate under an atmosphere including an oxygen gas and an inert gas. The gate structure has a gate oxide film pattern, a polysilicon film pattern and a metal silicide film pattern. A portion of the first oxide film formed on a sidewall of the polysilicon film pattern has a thickness substantially identical to that of a portion of the first oxide film formed on a sidewall of the metal silicide film pattern. A failure of a semiconductor device having the gate electrode can be minimized because the gate electrode has an improved sidewall profile.

19 Claims, 8 Drawing Sheets

U: UPPER PORTION OF FURNACE
M: MIDDLE PORTION OF FURNACE
L: LOWER PORTION OF FURNACE

METHOD OF FORMING A GATE ELECTRODE, METHOD OF MANUFACTURING A SEMICONDUCTOR DEVICE HAVING THE GATE ELECTRODE, AND METHOD OF OXIDIZING A SUBSTRATE

CROSS REFERENCE TO RELATED APPLICATIONS

This application claims priority under 35 USC §119 to Korean Patent Application 2002-66804, filed on Oct. 31, 2002, the contents of which are herein incorporated by reference in their entirety for all purposes.

BACKGROUND OF THE INVENTION

1. Field of the Invention

This disclosure relates to a method of forming a gate electrode, a method of manufacturing a semiconductor device having the gate electrode, and a method of oxidizing a substrate. More particularly, this disclosure relates to a method of forming a gate electrode having an improved sidewall profile, a method for manufacturing a semiconductor device having the gate electrode, and a method of oxidizing a substrate.

2. Description of the Related Art

Generally, semiconductor memory devices are classified as either volatile memory devices such as a dynamic random access memory (DRAM) or a static random access memory (SRAM), or non-volatile memory devices such as a read only memory (ROM). The volatile memory devices have rapid response speeds but data stored in the devices dissipate with time. On the other hand, the non-volatile memory devices have relatively slow response speeds but data stored in the devices are maintained.

Semiconductor memory devices have been highly integrated to fabricate many chips on one semiconductor memory device. Accordingly, a width of a pattern of the semiconductor memory devices or a distance between patterns of the semiconductor memory devices has been reduced. A width of a gate electrode of a transistor in a cell of the semiconductor memory devices or a distance between gate electrodes has also been reduced. Therefore, it has become increasingly difficult to obtain the required transistor characteristics for the semiconductor memory devices. Failures of the semiconductor memory devices increase when the series of processes for fabricating the semiconductor memory devices become more complex.

FIGS. 1A and 1B are cross-sectional diagrams illustrating a conventional method of forming a gate electrode of a cell transistor.

Referring to FIG. 1A, a gate structure 20 is formed on a semiconductor substrate 10. The gate structure 20 has a gate oxide film pattern 12, a polysilicon film pattern 14, a tungsten silicide film pattern 16, and a nitride film pattern 18.

Particularly, a thin gate oxide film having a thickness of about 30 to 200 Å is formed on the substrate 10, and a polysilicon film is formed on the gate oxide film using polysilicon doped with N-type or P-type impurities. A tungsten silicide film is formed on the polysilicon film, and a nitride film is formed on the tungsten silicide film.

After a photoresist pattern is formed on the nitride film, the nitride film, the tungsten silicide film, and the polysilicon film are etched using the photoresist pattern as an etching mask, thereby forming the nitride film pattern 18, the tungsten silicide film pattern 16, and the polysilicon film pattern 14 on the gate oxide film. Then, the photoresist pattern is removed using a plasma ashing process, a stripping process using sulfuric acid, and a cleaning process. When the photoresist pattern is removed with these processes, the gate oxide film exposed between the polysilicon film patterns 14 is removed from the substrate 10. Hence, the gate structure 20 is completed on the substrate 10.

Referring to FIG. 1B, the substrate 10, including the gate structure 20, is re-oxidized under an atmosphere including an oxygen gas so that an oxide film 22 is formed on a sidewall of the gate structure 20 and on the substrate 10.

The re-oxidizing process is executed to cure damages of the gate structure 20 and the substrate 10 caused by ions having high energies used during the etching process for gate structure 20. According to the re-oxidizing process, the oxygen gas reacts with silicon in the gate structure 20 and the substrate 10 so that the oxide film 22 is formed on the substrate 10 and on the sidewall of the gate structures 20.

The first oxide film 22 is formed on a sidewall of the polysilicon film pattern 14 and on a sidewall of the tungsten silicide film pattern 16. An oxidation rate of the tungsten silicide film pattern 16 is faster than that of the polysilicon film pattern 14. Hence, when the re-oxidation process is performed on the gate structure 20, a portion of the oxide film 22 (denoted by a circle A) formed on the sidewall of the tungsten silicide film pattern 16 is thicker than a portion of the oxide film 22 formed on the sidewall of the polysilicon film pattern 14. As a result, the gate structure 20 has a poor sidewall profile. In particular, the sidewall of the gate structure 20 has a negative slope where a portion of the oxide film 22 in the circle A protrudes in a horizontal direction.

In cases where the gate structure 20 has a sidewall with negative slope, an interlayer dielectric film may not completely fill the space between the gate structures 20 without generating a void therein. If voids are formed in the interlayer dielectric film, adjacent contacts may frequently connect with each other, causing an electrical failure between the contacts.

FIG. 2 is cross-sectional diagram illustrating a void generated in an interlayer dielectric film of a conventional semiconductor device and FIG. 3 is a plan diagram illustrating a failure of the conventional semiconductor device caused by the void in FIG. 2. FIG. 2 is a cross-sectional diagram of the void taken along the line B–B' in FIG. 3.

Referring to FIGS. 2 and 3, a nitride spacer 24 is formed on a sidewall of a gate electrode in order to form a self-aligned contact hole. An interlayer dielectric film 26 is formed on the substrate 10 to cover the gate electrode including the nitride spacer 24. After the interlayer dielectric film 26 is etched to form the self-contact hole, the self-aligned contact hole is filled with a conductive material to form a self-contact 28. At this time, the conductive material also fills the void 30 generated in the interlayer dielectric film 26. Therefore, adjacent contacts 28 may be connected with each other through the conductive material filling the void 30, causing an electrical failure.

As for a re-oxidation process for a gate electrode, a method for preventing an excess oxidation of a tungsten silicide film is disclosed in Japanese Patent Laid-Open Publication No. 8-32066 or Japanese Patent Laid-Open Publication No. 11-345970.

In the Japanese Patent Laid-Open Publication No. 8-32066, after a polycide layer (including a polysilicon film and a tungsten silicide film) is etched to form a polycide film pattern, the polycide film pattern is thermally treated at a temperature of about 900° C. for about 60 minutes. Thus, an oxide film is formed on the polycide film pattern. Next, the polycide film pattern including the oxide film is thermally treated under an atmosphere including an oxygen gas and a nitrogen gas. However, because the tungsten silicide film is oxidized faster than the polysilicon film during the thermal treatment at the temperature of about 900° C. for about 60 minutes, an abnormal oxidation of the tungsten silicide film may not be sufficiently prevented.

According to the Japanese Patent Laid-Open Publication No. 11-345970, a polycide film (including a tungsten silicide film and a polysilicon film) is etched to form a polycide film pattern. After the polycide film pattern is given a primary thermal treatment under an atmosphere including an inert gas, it is then given a secondary thermal treatment under a strong oxygen atmosphere. However, during the secondary thermal treatment, the tungsten silicide film is oxidized faster than the polysilicon film. Thus, abnormal oxidation of the tungsten silicide film may not be effectively prevented.

Embodiments of the invention address these and other disadvantages of the prior art.

SUMMARY OF THE INVENTION

Embodiments of the invention provide a method of forming a gate electrode having an improved sidewall profile and provide a method of manufacturing a semiconductor device having gate electrodes with the improved sidewall profile. Embodiments of the invention also provide a method of oxidizing a surface of a substrate including a gate structure with the improved sidewall profile. Because the gate structure has an improved sidewall profile without protuberances, voids are not formed in the interlayer dielectric film covering the gate structure. Consequently, failures in a semiconductor device that include the gate electrodes can be minimized during formation of the interlayer dielectric film and a contact.

BRIEF DESCRIPTION OF THE DRAWINGS

The above and other features and advantages of the invention will become readily apparent by reference to the following detailed description when considered in conjunction with the accompanying drawings.

DETAILED DESCRIPTION OF THE INVENTION

The invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. The relative thickness of layers in the illustrations may be exaggerated for purposes of describing the present invention.

Figure 4A:
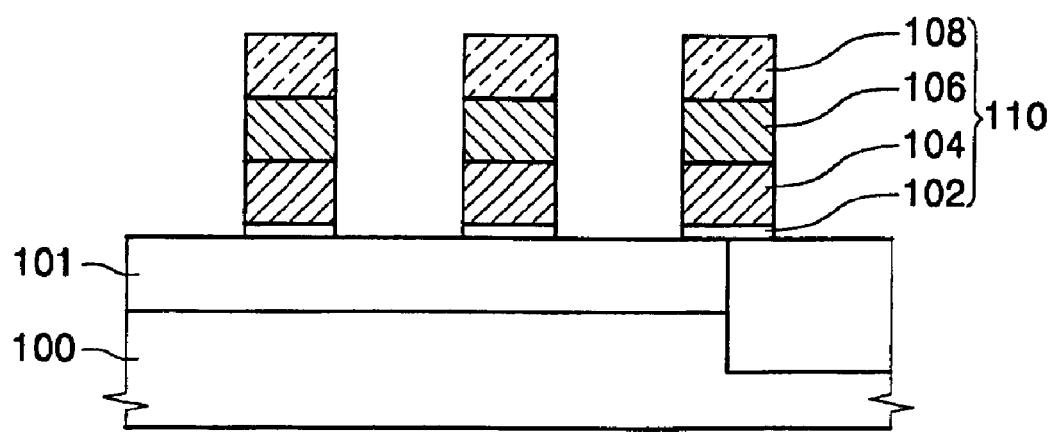
FIGS. 4A and 4B are cross-sectional diagrams illustrating a method of forming a gate electrode of a cell transistor according to an embodiment of the invention.
Figure 4B:
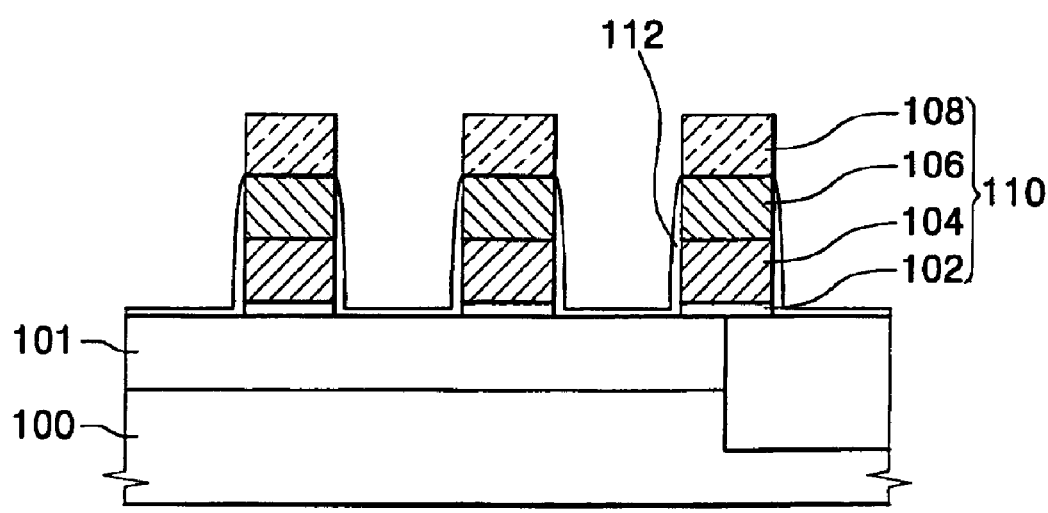

FIGS. 4A and 4B are cross-sectional diagrams illustrating a method of forming a gate electrode of a cell transistor according to an embodiment of the invention. In FIGS. 4A and 4B, a gate electrode of an N-type cell transistor is formed on a semiconductor substrate.

Referring to FIG. 4A, a gate structure 110 is formed on a semiconductor substrate 100. The gate structure 110 includes a gate oxide film pattern 102 formed on the substrate 100, a polysilicon film pattern 104 formed on the gate oxide film pattern 102, a tungsten silicide film pattern 106 formed on the polysilicon film pattern 104, and a nitride film pattern 108 formed on the tungsten silicide film pattern 106.

A P-type well 101 doped with P-type impurities is formed at portions of the substrate 100 beneath the gate structure 110. For example, the P-type well 101 may be doped with boron (B) ions.

A thin gate oxide film having a thickness of about 30 to 200 Å is formed on the semiconductor substrate 100. A polysilicon film doped with N-type or P-type impurities is formed on the gate oxide film. A tungsten silicide film is formed on the polysilicon film, and a nitride film is formed on the tungsten silicide film. After a photoresist pattern is formed on the nitride film to define a gate electrode, the nitride film, the tungsten silicide film, the polysilicon film, and the gate oxide film are successively etched using the photoresist pattern as an etching mask. This forms the gate structure 110 including the gate oxide film pattern 102, the polysilicon film pattern 104, the tungsten silicide film pattern 106, and the nitride film pattern 108. The photoresist pattern is then removed by an ashing process and a stripping process.

When the photoresist pattern is removed, the gate oxide film positioned on a portion of the substrate 100 between the gate structures 110 is nearly removed during a plasma ashing process, a stripping process using sulfuric acid, and a cleaning process.

In this embodiment, the polysilicon film pattern 104 is generally formed using N-type polysilicon doped with ions of Group V elements. The polysilicon film pattern 104 serves as a conductive pattern for a gate electrode of an N-type cell transistor. For example, the polysilicon film pattern 104 includes N-type polysilicon doped with phosphorus (P) or arsenic (As).

Meanwhile, since the conductive pattern of the gate electrode is formed using the N-type polysilicon and the P-type well 101 is formed beneath the gate electrode, an inversion region may be rapidly formed at a surface of the substrate 100 beneath the gate electrode when a voltage is applied to the gate electrode. A threshold voltage of the transistor having the above construction is relatively lower than that of a transistor that includes a conductive pattern formed using a polysilicon film pattern doped with P-type impurities. Although a concentration of P-type impurities doped in the P-type well 101 is augmented to improve the threshold voltage of the transistor, a bulk leakage current may increase when the concentration of the P-type impurities is augmented. Hence, the transistor may have poor static refresh characteristics.

Accordingly, in this embodiment, the polysilicon film pattern 104 is formed using P-type polysilicon instead of N-type polysilicon to improve the static refresh characteristic of the transistor while the transistor has a desired threshold voltage. When the conductive pattern of the gate electrode is formed using P-type polysilicon, the voltage required for forming the inversion region at the surface of the substrate 100 becomes relatively high because the P-type well 101 is formed beneath the gate electrode. Here, the P-type polysilicon is doped with P-type impurities from Group III elements like boron (B).

Referring to FIG. 4B, the substrate 100, including the gate structure 110, is reoxidized under an atmosphere including an oxygen gas and an inert gas. An oxide film 112 is formed on the substrate 100 and on a sidewall of the gate structure 110. Thus, the gate structure 110 having the oxide film 112 is completed.

The re-oxidation process is performed on the substrate 100 and the gate structure 110 to cure damages to the gate structure 110 and the substrate 100 caused by the impaction of ions with high energies during the etching process for forming the gate structure 110. That is, the substrate 110 and the gate structure 110 are re-oxidized under an oxygen atmosphere so that damage to the gate structure 110 and the substrate 100 are cured.

Figure 5:
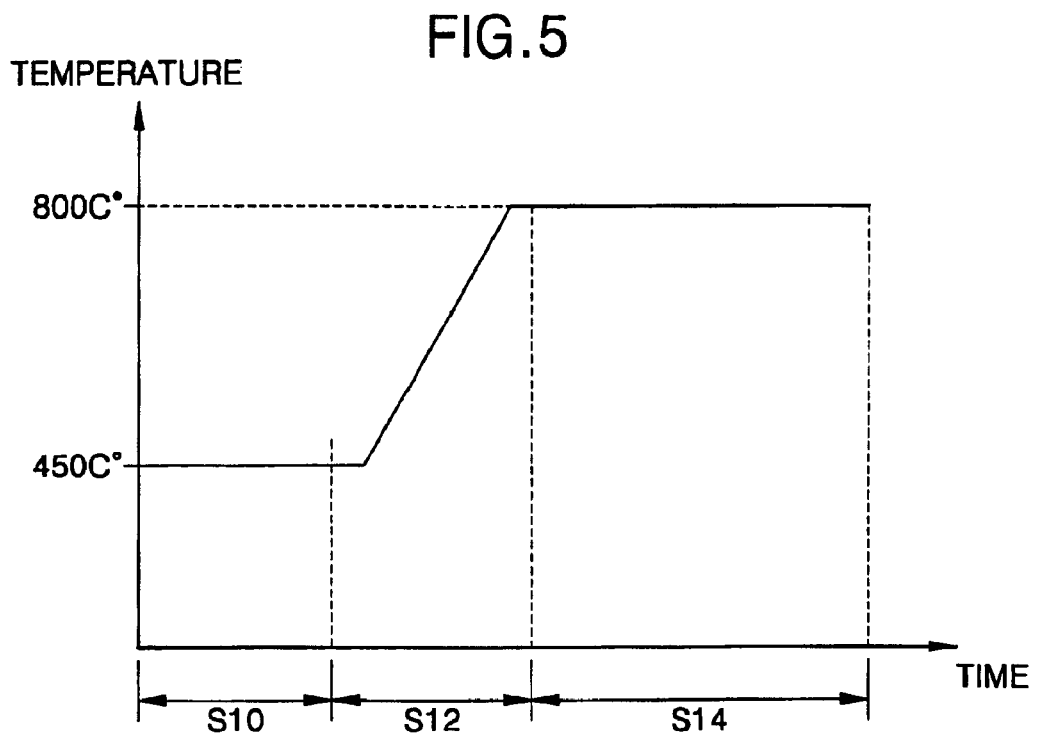
FIG. 5 is a graph illustrating temperature variation in a process for re-oxidizing a substrate including a gate structure according to the embodiment of FIGS. 4A and 4B.

FIG. 5 is a graph illustrating temperature variation in a re-oxidizing process for the substrate 100, including the gate structure 110, according to the embodiment of FIG. 4. With reference to FIGS. 4A, 4B, and 5, the re-oxidizing process begins by loading the substrate 100, including the gate structure 110, into a furnace having an initial temperature in the range of about 400 to 480° C. In this embodiment, the initial temperature is 450° C.

When the furnace has a temperature higher than about 480° C., oxidizing agents remaining in the furnace react with silicon contained in the gate structure 110 and in the substrate 100 to form a native oxide film on the substrate 100 and on the sidewall of the gate structure 110. When the furnace has a temperature lower than about 400°, additional time is needed for raising the temperature of the furnace so that an oxide film may be formed on the substrate 100 and on the sidewall of the gate structure 110.

An inert gas is introduced into the furnace at a flow rate in the range of about 30 to about 50 standard liters per minute (slm) while the substrate 100 is being loaded into the furnace (interval S10). The inert gas carries the oxidizing agent from the furnace to the outside and prevents a surface of the substrate 100 from making contact with the oxidizing agent, thereby minimizing formation of the native oxide film on the substrate 100. If the flow rate of the inert gas is larger than about 50 slm, the thickness distribution of the oxide film 112 on the substrate 100 and on the sidewall of the gate structure 110 becomes too large in accordance with a position of the substrate 100 in the furnace. The reason for this will be explained in detail with reference to FIGS. 6, 7, and 8. In this case, the inert gas may include nitrogen, argon, or helium. Preferably, the inert gas includes nitrogen in consideration of the stability and economic efficiency of the process for forming the oxide film 112.

According to this embodiment, the furnace has a relatively low temperature and inert gas is provided into the furnace when the substrate 100 is loaded into the furnace. This minimizes the formation of the native oxide film on the substrate 100 and on the sidewall of the gate structure 110. Therefore, the gate structure 110 has an improved sidewall profile.

When the substrate 100 is completely loaded in the furnace, the temperature of the furnace is augmented by a rate of about 5 to 15° C./min until the furnace reaches a temperature in the range of about 800 to about 900° C. (interval S12). During interval S12, the inert gas continues to be introduced into the furnace at a flow rate of about 30 to 50 slm to minimize the formation of the native oxide film on the substrate 100 and on the sidewall of the gate structure 110.

When the furnace has reached a temperature of about 800 to 900° C., the temperature of the furnace is constantly maintained (interval S14). At this point, the inert gas is provided to the furnace for about 10 to 15 additional minutes. Because the furnace has a constantly maintained temperature for forming the oxide film 112 on the substrate 100 and on the sidewall of the gate structure 110, temperature variations inside of the furnace can be minimized.

The oxygen gas and the inert gas are provided into the furnace for a predetermined time so that an oxide film 112 having a desired thickness is formed on the substrate 100 and on the sidewall of the gate structure 110 (interval S14). The inert gas may include nitrogen, argon, and helium. Preferably, the inert gas includes nitrogen in consideration of the stability and the economical efficiency of the process for forming the oxide film 112. The inert gas reduces a partial pressure of the oxygen gas in the furnace. As a result, the formation rate of the oxide film 112 on the substrate 100 and on the sidewall of the gate electrode 110 decreases.

Figure 1A:
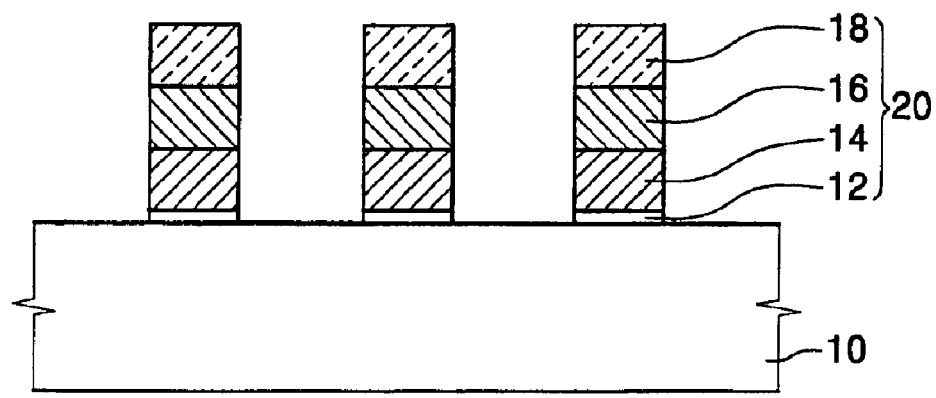
FIGS. 1A and 1B are cross-sectional diagrams illustrating a conventional method of forming a gate electrode of a cell transistor.
Figure 1B:
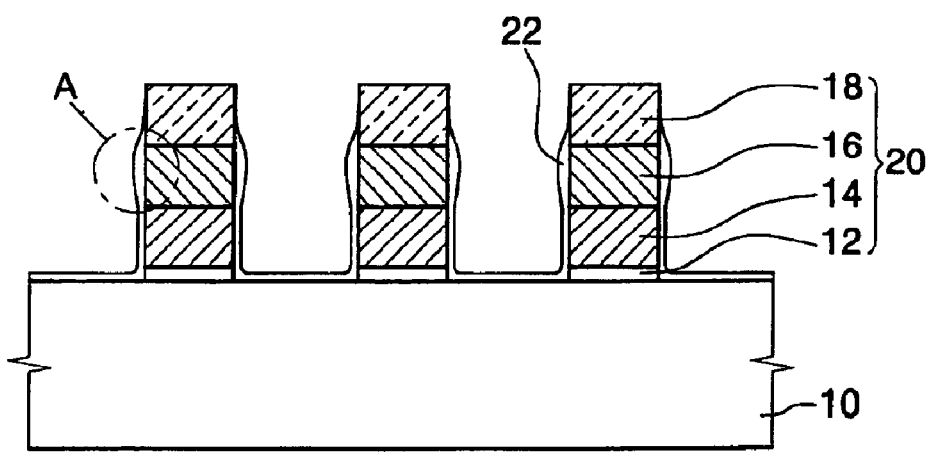
Figure 2:
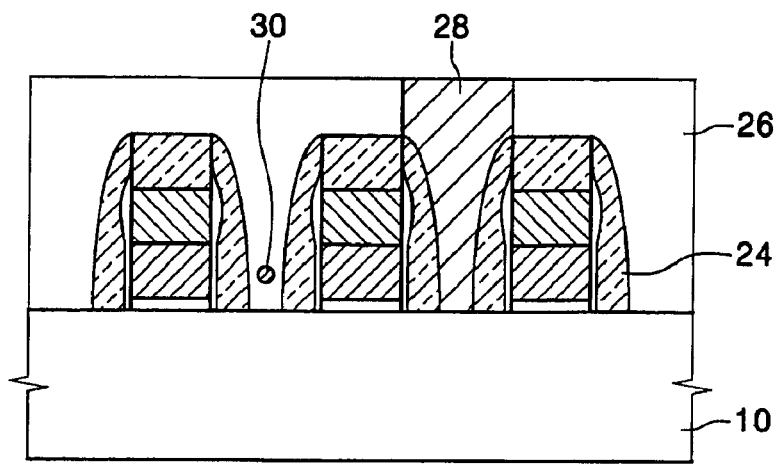
FIG. 2 is cross-sectional diagram illustrating a void generated in an interlayer dielectric film of a conventional semiconductor device.
Figure 3:
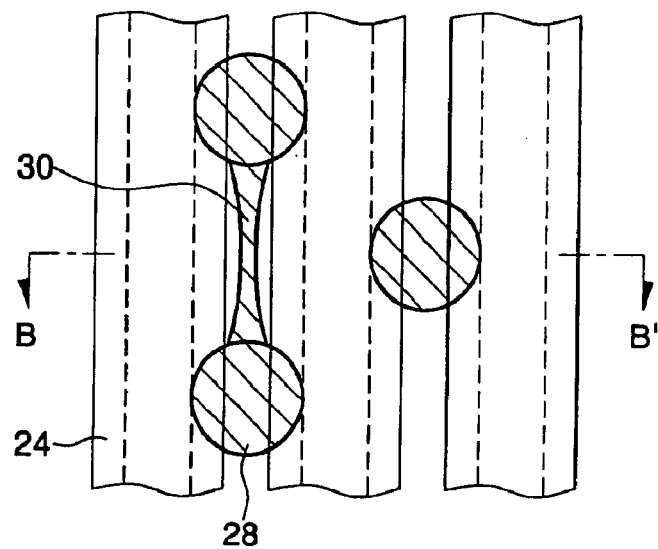
FIG. 3 is a plan diagram illustrating a failure of the conventional semiconductor device caused by the void in FIG. 2.

Preferably, the volume ratio between the oxygen gas and the inert gas is between about 1.0:0.9 and 1.0:1.1. If too much inert gas is provided, the relative proportion of oxygen gas serving as the oxidizing agent is decreased so much that the formation rate of the oxide film 112 on the substrate 100 and on the sidewall of the gate structure 110 becomes unbearably slow. Hence, the time required for forming the oxide film 112 to the desired thickness is considerably increased. On the other hand, if too little inert gas is introduced, the gate structure 110 may have a deteriorated sidewall profile like that of FIGS. 1B and 2.

After various experiments, the results of which will be discussed below with reference to FIGS. 6, 7, and 8, the inventors found that the formation rate of the oxide film 112 on the sidewall of the tungsten silicide film 106 could be decreased in comparison with a formation rate of the oxide film 112 on the sidewall of the polysilicon film pattern 104. This decreased formation rate considerably reduces the thickness difference between a portion of the oxide film 112 on the sidewall of the tungsten silicide film pattern 106 and a portion of the oxide film 112 on the sidewall of the polysilicon film pattern 104. Thus, the gate structure 110 may have an excellent sidewall profile with no protruding portions.

Figure 6:
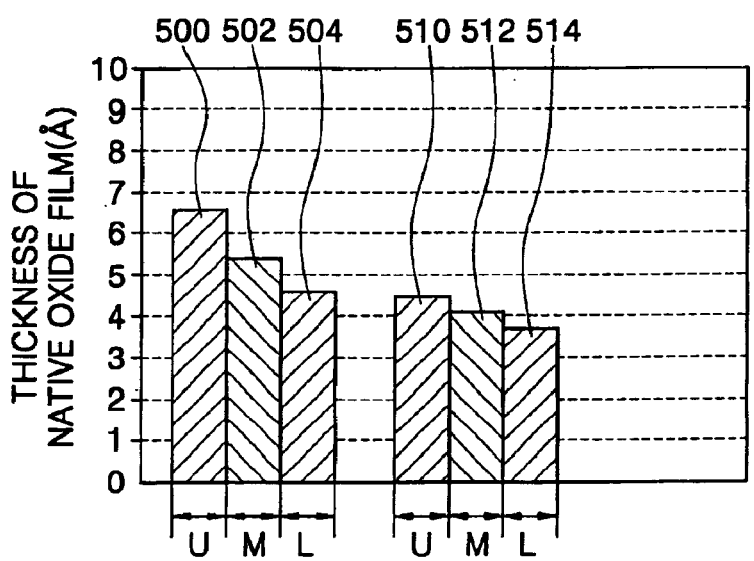
FIG. 6 is a graph illustrating a thickness of a native oxide film formed on a substrate relative to a temperature of a furnace.

FIG. 6 is a graph illustrating a thickness of a native oxide film formed on a substrate relative to a temperature of the furnace. In FIG. 6, native oxide films are formed on substrates when the substrates are loaded into a furnace having a predetermined temperature. Here, the substrates are bare silicon substrates having no patterns. The furnace is a vertical type furnace and the substrates are loaded by moving a boat from a lower portion of the furnace toward an upper portion of the furnace after the substrates are placed on the boat.

Referring to FIG. 6, when the furnace has a temperature of about 650°, the native oxide films are formed on the substrates 500, 502 and 504 to a thickness of about 4.5 to about 6.4 Å in accordance with the vertical position of the substrates 500, 502 and 504 in the furnace. The substrate 500 positioned at an upper portion of the furnace has a native oxide film that is thicker than that of the substrate 504 at a lower portion of the furnace. This is because the substrate 500 has been in the furnace relatively longer than the substrate 504. The thickness difference between the native oxide films of the substrates 500 and 504 is about 2 Å.

Meanwhile, when the furnace has a temperature of about 450° C., the native oxide films are formed on the substrates 510, 512 and 514 to a thickness of about 3.6 to 4.4 Å according to the vertical positions of the substrates 510, 512 and 514 in the furnace. For this temperature, the thickness difference between the native oxide films of the substrates 510 and 514 is about 0.8 Å. Accordingly, when the substrates 500, 502, 504, 510, 512, and 514 are loaded in the furnace, the thickness difference between the native oxide film on the substrates 500, 502, 504, 510, 512 and 514 may be decreased if the furnace has a relatively low temperature.

Figure 7:
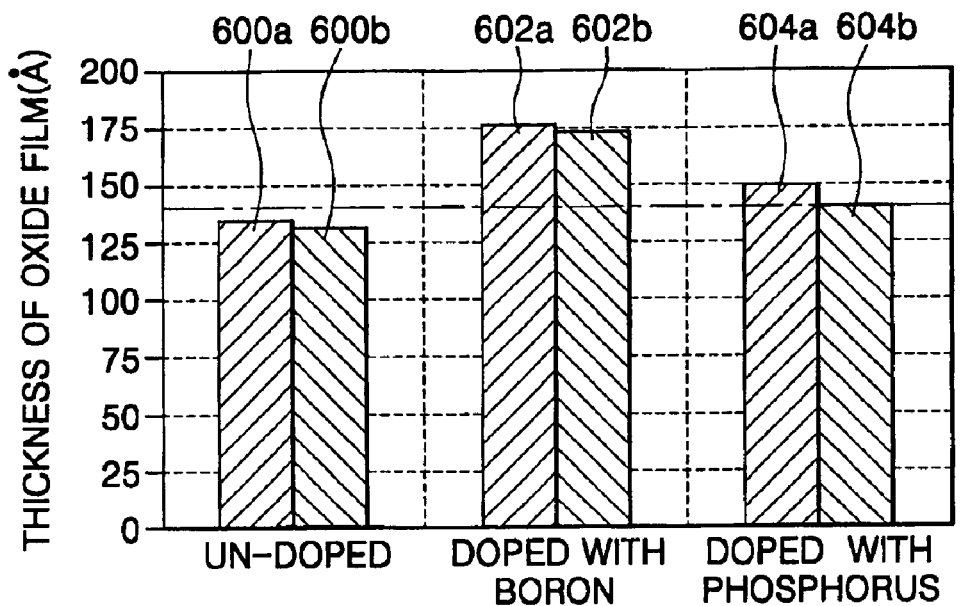
FIG. 7 is a graph illustrating a thickness of an oxide film formed on a tungsten silicide film positioned on a polysilicon film relative to impurities doped in the polysilicon film.

FIG. 7 is a graph illustrating the thickness of an oxide film relative to the impurities doped in a polysilicon film, where the oxide film is formed on a tungsten silicide film that is positioned on the polysilicon film. In FIG. 7, polysilicon films are formed on first to six substrates 600a, 600b, 602a, 602b, 604a and 604b, respectively. The types of impurities doped in the polysilicon films are split. Here, the polysilicon films formed on the first and second substrates 600a and 600b are not doped with impurities while the polysilicon films formed on the third and fourth substrates 602a and 602b are doped with P-type impurities like boron (B). In addition, the polysilicon films formed on the fifth and sixth substrates 604a and 604b are doped with N-type impurities like phosphorus (P). The processes for re-oxidizing the first to sixth substrates 600a, 600b, 602a, 602b, 604a and 604b are executed under an oxygen atmosphere in accordance with a conventional method.

Referring to FIG. 7, when the re-oxidizing processes are accomplished on the first to sixth substrates 600a, 600b, 602a, 602b, 604a and 604b, the oxide films associated with the first and second substrates 600a and 600b are the thinnest. Although the oxide films associated with the fifth and sixth substrates 604a and 604b are thicker than the oxide films associated with the first and second substrates 600a and 600b, the thickness difference between these oxide films is relatively small. However, the oxide films associated with the third and fourth substrates 602a and 602b are very thick compared to the oxide films associated with the first and second substrates 600a and 600b.

As shown in FIG. 7, when the substrates are re-oxidized according to the conventional method, the thickness of the associated oxide films are dependent on the sorts of impurities doped in the associated polysilicon films. FIG. 7 illustrates that the oxide film associated with the polysilicon film doped with P-type impurities is the thickest.

Figure 8:
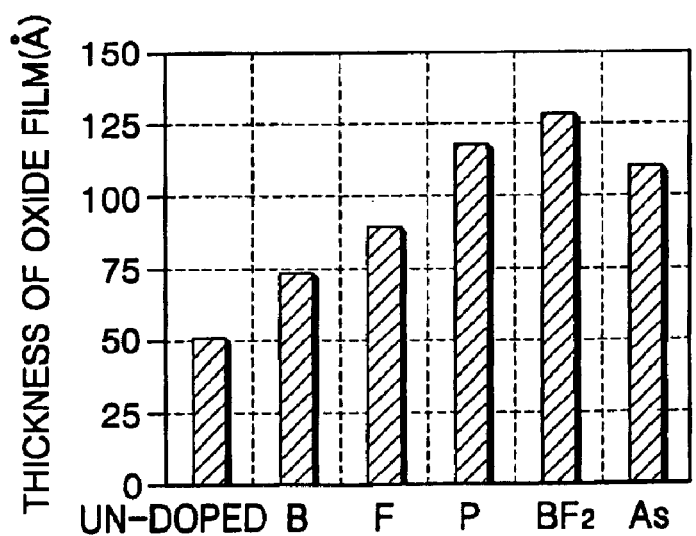
FIG. 8 is a graph illustrating a thickness of an oxide film formed on a silicon film relative to impurities doped in the silicon film.

FIG. 8 is a graph illustrating a thickness of an oxide film formed on a silicon film relative to impurities doped in the silicon film. In FIG. 8, different impurities are injected into silicon films at different implantation energies so that depths of the different impurities implanted into the silicon films are identical to one another. The thickness of the oxide film formed on the silicon film was then measured. Oxidations of the silicon films were accomplished in a single type chamber using a rapid thermal process for about 110 seconds. The single type chamber has a temperature of about 1,000° C. and an oxygen gas is provided into the single type chamber at a flow rate of about 5 slm during the oxidation process. After the oxidation process is performed on a bare silicon wafer, an oxide film having a thickness of about 50 Å was formed on the wafer.

Referring to FIG. 8, an oxide film with a thickness of about 75 Å was formed on a silicon film doped with the P-type impurity boron (B). Meanwhile, oxide films with a thickness in the range of about 110 to 116 Å were formed on a silicon film doped with N-type impurities such as arsenic (As) or phosphorus (P).

As shown in FIGS. 7 and 8, when a gate structure includes a polysilicon film pattern doped with P-type impurities and a tungsten silicide film pattern, an oxide film formed on the sidewall of the tungsten silicide film pattern is relatively thick compared to an oxide film formed on the sidewall of the polysilicon film pattern. To the contrary, when a gate structure includes a polysilicon film pattern doped with N-type impurities and a tungsten silicide film pattern, an oxide film formed on the sidewall of the tungsten silicide film pattern is relatively thin compared to an oxide film formed on the sidewall of the polysilicon film pattern. In other words, when the gate structure that includes a polysilicon film pattern doped with P-type impurities undergoes a conventional re-oxidizing process, the resulting gate structure exhibits a poor sidewall profile.

However, according to an embodiment of the invention, although the gate structure of the cell transistor includes a polysilicon film pattern doped with P-type impurities and a tungsten silicide film pattern, the gate structure has an improved sidewall profile. Additionally, the flow rate of the inert gas may be adjusted during the re-oxidation process in accordance with the type and concentration of the impurities present in the polysilicon film pattern.

FIGS. 9A to 9F are cross-sectional diagrams illustrating a method for manufacturing a semiconductor device, including a gate electrode, according to another embodiment of the invention.

Figure 9A:
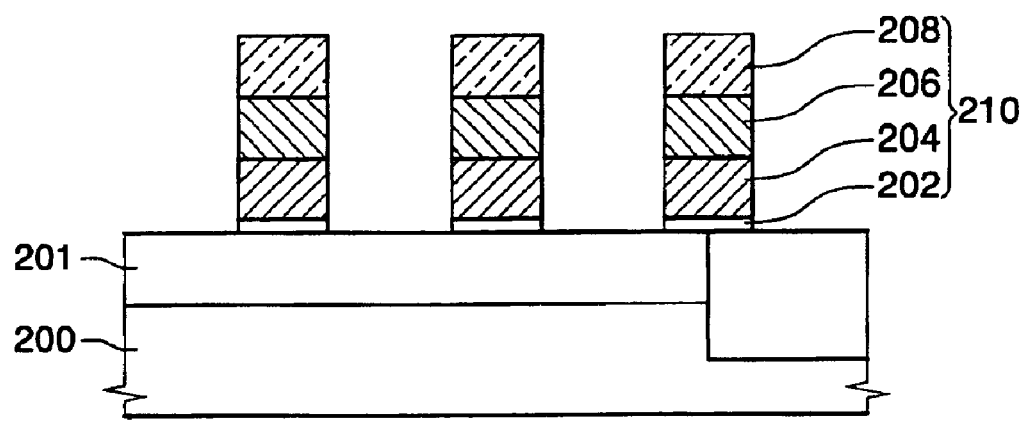
FIGS. 9A to 9F are cross-sectional diagrams illustrating a method for manufacturing a semiconductor device including a gate electrode according to another embodiment of the invention.

Referring to FIG. 9A, gate structures 210 are formed on a semiconductor substrate 200. The gate structures 210 include gate oxide film patterns 202, polysilicon film patterns 204, tungsten silicide film patterns 206, and nitride film patterns 208. A P-type well 201 is formed on a portion of the substrate 200 beneath the gate structures 210 by doping P-type impurities into that portion.

Figure 9B:
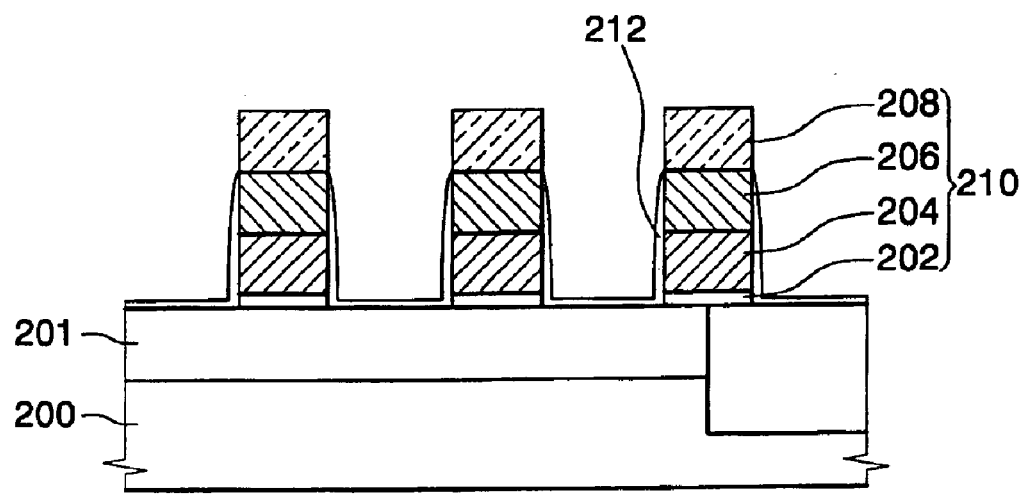

Referring to FIG. 9B, the substrate 200, including the gate structures 210, is primarily re-oxidized under an atmosphere including an oxygen gas and an inert gas. Thus, a first oxide film 212 is formed on sidewalls of the gate structures 210 and the substrate 200. Here, the portion of the first oxide film 212 formed on a sidewall of the polysilicon film pattern 204 has a thickness substantially identical to that of a portion of the first oxide film 212 formed on a sidewall of the tungsten silicide film 206. That is, a growth rate difference between portions of the first oxide film 212 on the sidewalls of the polysilicon film pattern 204 and the tungsten silicide film 206 is minimized by forming the first oxide film 212 under the atmosphere that includes the oxygen gas and the inert gas.

In this embodiment, the process for forming the first oxide film 212 is identical to the process described above for FIG. 4B. Namely, the temperature of a furnace for re-oxidizing the substrate 200, including the gate structures 210, is adjusted so that the furnace has a temperature in the range of about 400 to 480° C. Then, the inert gas is provided into the furnace at a flow rate of about 30 to 50 slm during the time the substrate 200 is loaded into the furnace. After the substrate 200 is loaded into the furnace, the temperature of the furnace is increased so that the furnace has a temperature in the range of about 800 to 900° C. while the inert gas is continuously flowed into the furnace. Subsequently, the first oxide film 212 is formed on the sidewalls of the gate structures 219 and on the substrate 200 by providing the oxygen gas and the inert gas for a predetermined time. Here, a volume ratio between the oxygen gas and the inert gas is between about 1.0:0.9 and 1.0:1.1.

With the above-described process, the first oxide film 212 having a minimized thickness difference is formed on entire sidewalls of the gate structures 210.

Figure 9C:
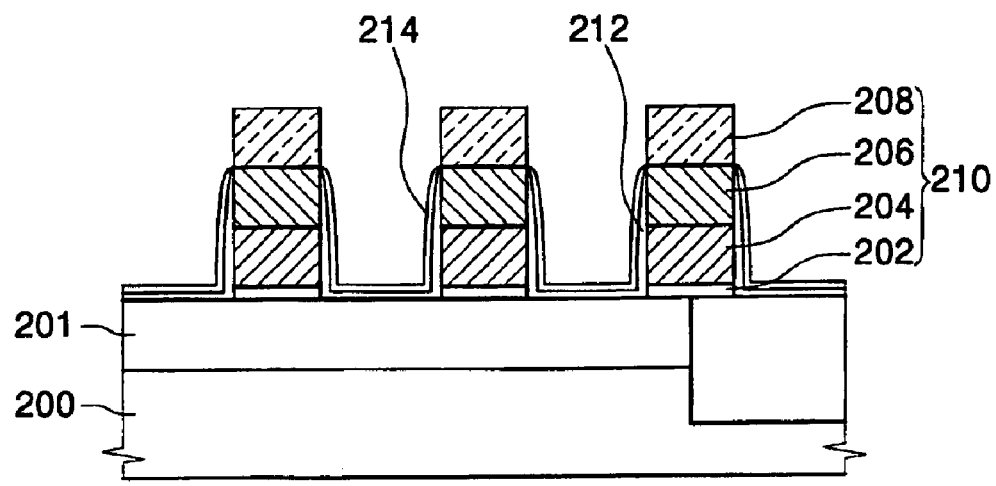

Referring to FIG. 9C, the substrate 210, including the gate structures 210, is secondarily re-oxidized under an atmosphere including an oxygen gas, thereby forming a second oxide film 214 on the first oxide film 212.

In particular, after the inert gas for forming the first oxide film 212 is removed from the furnace, it is replaced by the equivalent volume of oxygen gas. Consequently, the entire volume of oxygen gas in the furnace is twice the volume of the oxygen gas for forming the first oxide film 212. Alternatively, a gas containing chlorine such as HCl, $Cl_2$ or $C_2HCl_3$ may be additionally provided to the furnace. In this case, the volume of the gas containing chlorine is about 1 to 10 percent of the volume of oxygen gas. Introduction of a gas containing chlorine may reduce bird's beaks generated at end portions of the gate oxide film pattern 202.

As for the secondary re-oxidizing process of the substrate 200 and the gate structures 210, the partial pressure of the oxygen gas is augmented in the furnace because the second oxide film 214 is formed under the oxygen atmosphere without an introduction of the inert gas. In addition, the flow rate of the oxygen gas in the secondary re-oxidation process is higher than that of the oxygen gas in the primary re-oxidation process. Therefore, the reaction rate of the secondary re-oxidation process is faster than that of the primary re-oxidation process. That is, the thickness of the second oxide film 214 would be greater than that of the first oxide film 212 if the primary and secondary re-oxidation processes were executed for the same amount of time.

The entire thickness of the first oxide film 212 is substantially uniform along the sidewalls of the polysilicon film pattern 204 and the tungsten silicide film pattern 206. Also, the second oxide film 214 is formed on the first oxide film 212 to have has a substantially uniform thickness. Thus, the gate structures 210 have excellent sidewall profiles.

Figure 9D:
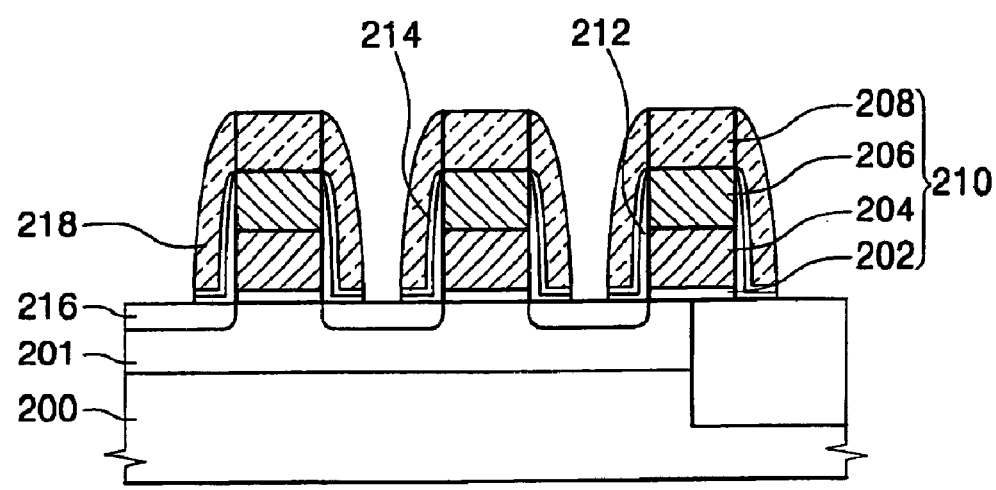

Referring to FIG. 9D, source/drain regions 216 are formed in the substrate 200 by implanting impurities into portions of the substrate 200 between the gate structures 210 using the gate structures 210 as masks.

Nitride spacers 218 are formed on the sidewalls of the gate structures 210 where the first and second oxide films 212 and 214 are positioned. Because the gate structures 210 have improved sidewall profiles, the nitride spacers 218 also have excellent sidewall profiles without protuberances.

Figure 9E:
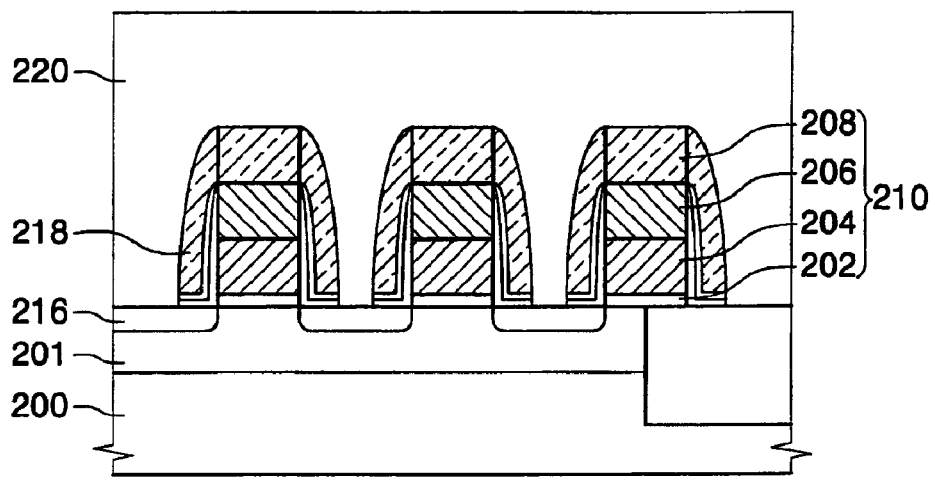

Referring to FIG. 9E, an interlayer dielectric film 220 is formed on the substrate 200 to cover the gate structures 210. Here, the nitride spacers 218 enable the interlayer dielectric film 220 to fill up the space between the gate structures 210 so that voids are not generated between the gate structures 210.

Figure 9F:
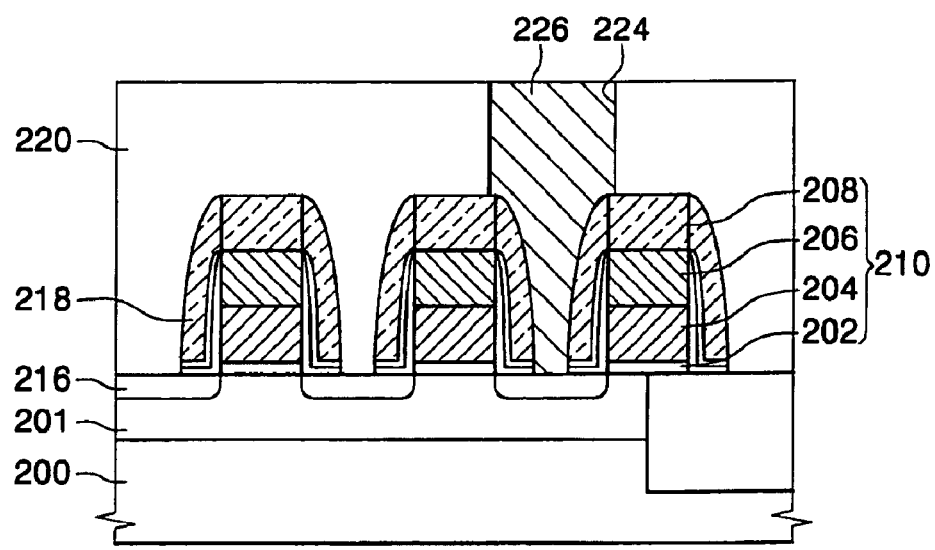

Referring to FIG. 9F, a self-aligned contact hole 224 is formed by partially etching the interlayer dielectric film 220. The self-aligned contact hole 224 exposes the portion of the substrate 200 between the nitride spacers 218 corresponding to the source/drain region 216. The self-aligned contact hole 224 is filled with a conductive material to form a contact 226 electrically connected to the source/drain region 216.

According to this embodiment, failures of a semiconductor device including the gate electrodes can be minimized during formation of an interlayer dielectric film and a contact because the gate electrodes have improved profiles.

Embodiments of the invention will now be described in a non-limiting way.

According to one aspect of the invention, a method of forming a gate electrode having an improved profile is provided. A gate structure is formed on a semiconductor substrate. The gate structure includes a gate oxide film pattern, a polysilicon film pattern, and a metal silicide film pattern. A first oxide film is formed on a sidewall of the gate structure and on the semiconductor substrate by re-oxidizing the gate structure and the substrate under an atmosphere including an oxygen gas and an inert gas. Here, a portion of the first oxide film formed on a sidewall of the polysilicon film pattern has a thickness substantially identical to that of a portion of the first oxide film formed on a sidewall of the metal silicide film pattern.

In accordance with another aspect of the invention, a method of manufacturing a semiconductor device having a gate electrode with an improved profile is provided. Gate structures are formed on a semiconductor substrate. The gate structures include gate oxide film patterns, polysilicon film patterns, metal silicide film patterns, and nitride film patterns. A first oxide film is formed on sidewalls of the gate structures and on the semiconductor substrate by re-oxidizing the gate structures and the substrate under an atmosphere including an oxygen gas and an inert gas. Here, portions of the first oxide film formed on sidewalls of the polysilicon film patterns have a thickness substantially identical to that of portions of the first oxide film formed on sidewalls of the metal silicide film patterns. Subsequently, nitride spacers are formed on sidewalls of the gate structures including the first oxide film, and an interlayer dielectric film is formed to cover the gate structures. After a self-aligned contact hole exposing a portion of the substrate between the gate structures is formed by partially etching the interlayer dielectric film, a contact filling up the self aligned contact hole is formed using a conductive material.

In accordance with still another aspect of the invention, a method of oxidizing a surface of a substrate including a gate structure having an improved sidewall profile is provided. A furnace having a first temperature is provided, and a substrate is loaded into the furnace including a gate structure formed thereon. Subsequently, the temperature of the furnace is raised so that the furnace has a second temperature while a first inert gas is introduced into the furnace. Then, a first oxide film is formed on a sidewall of the gate structure and on the semiconductor substrate by re-oxidizing the gate structure and the substrate under an atmosphere including an oxygen gas and a second inert gas. Here, the first oxide film has a substantially identical thickness on an entire sidewall of the gate structure. The first temperature is preferably about 400 to about 480° C., and the second temperature is preferably about 800 to about 900° C.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a gate electrode comprising:

forming a gate structure on a semiconductor substrate, the gate structure having a gate oxide film pattern, a polysilicon film pattern, and a metal silicide film pattern; and forming a first oxide film on a sidewall of the gate structure and on the semiconductor substrate by re-oxidizing the gate structure and the substrate under an atmosphere including an oxygen gas and an inert gas, wherein a portion of the first oxide film formed on a sidewall of the polysilicon film pattern has a thickness substantially identical to that of a portion of the first oxide film formed on a sidewall of the metal silicide film pattern. and a volume ratio between the oxygen gas and the inert gas ranges between about 1.0:0.9 and about 1.0:1.1.

2. The method of claim 1, wherein the polysilicon film pattern is doped with impurities chosen from the group consisting of Group III elements and Group V elements.

3. The method of claim 1, wherein the inert gas comprises a gas chosen from the group consisting of nitrogen, argon, and helium.

4. The method of claim 1, further comprising, prior to forming the first oxide film:

setting a furnace temperature of a furnace in a range of about 400 to about 480° C.;

loading the gate structure and the semiconductor substrate into the furnace; and raising the furnace temperature to a range of about 800 to about 900° C. while the inert gas is provided into the furnace.

5. The method of claim 4, wherein a flow rate of the inert gas is about 30 to 50 slm.

6. The method of claim 1, further comprising, after forming the first oxide film: forming a second oxide film on the first oxide film by oxidizing the gate structure and the substrate in an atmosphere, wherein the atmosphere comprises a gas selected from the group consisting of an oxygen gas and a mixture of oxygen gas and a chlorine-containing gas.

7. The method of claim 6, wherein the chlorine-containing gas comprises one selected from the group consisting of HCl, $Cl_2$, and $C_2HCl_3$.

8. The method of claim 1, wherein the metal silicide film pattern comprises a tungsten silicide film pattern.

9. A method of manufacturing a semiconductor device including a gate electrode comprising:

forming gate structures on a semiconductor substrate, the gate structures having gate oxide film patterns, polysilicon film patterns, metal silicide film patterns, and nitride film patterns;

forming a first oxide film on sidewalls of the gate structures and on the semiconductor substrate by re-oxidizing the gate structures and the substrate under an atmosphere including an oxygen gas and an inert gas, wherein portions of the first oxide film formed on sidewalls of the polysilicon film patterns have a thickness substantially identical to that of portions of the first oxide film formed on sidewalls of the metal silicide film patterns;

forming nitride spacers on the sidewalls of the gate structures and the first oxide film;

forming an interlayer dielectric film to cover the gate structures;

forming a self-aligned contact hole exposing a portion of the substrate between the gate structures by partially etching the interlayer dielectric film; and forming a contact by filling the self-aligned contact hole with a conductive material.

10. The method of claim 9, wherein the polysilicon film patterns are doped with impurities chosen from the group consisting of Group III elements and Group V elements.

11. The method of claim 9, wherein a volume ratio between the oxygen gas and the inert gas ranges between about 1.0:0.9 and about 1.0:1.1.

12. The method of claim 9, further comprising, prior to forming the first oxide film:

adjusting a temperature of a furnace for re-oxidizing the gate structures and the substrate so that the furnace has a temperature in the range of about 400 to about 480° C.;

loading the substrate including the gate structures formed thereon into the furnace; and raising the temperature of the furnace so that the furnace has a temperature in the range of about 800 to about 900° C. while the inert gas is provided into the furnace.

13. The method of claim 9, further comprising, after forming the first oxide film: forming a second oxide film on the first oxide film by oxidizing the gate structures and the substrate in an atmosphere chosen from the group consisting of an oxygen atmosphere and an atmosphere that includes an oxygen gas and a chlorine-containing gas.

14. A method for oxidizing a substrate comprising:

providing a furnace having a first temperature;

loading the substrate including a gate structure formed thereon into the furnace;

raising a temperature of the furnace so that the furnace has a second temperature higher than the first temperature while a first inert gas is introduced into the furnace; and forming a first oxide film on a sidewall of the gate structure and on the semiconductor substrate by re-oxidizing the gate structure and the substrate under an atmosphere including an oxygen gas and a second inert gas, wherein the first oxide film has a substantially same thickness on an entire sidewall of the gate structure.

15. The method of claim 14, wherein the first temperature is about 400 to 480° C.

16. The method of claim 14, wherein the second temperature is about 800 to 900° C.

17. The method of claim 14, wherein a volume ratio between the oxygen gas and the second inert gas is about 1.0:0.9 to about 1.0:1.1.

18. The method of claim 14, further comprising, after forming the first oxide film: forming a second oxide film on the first oxide film by oxidizing the gate structure and the substrate under an atmosphere chosen from the group consisting of an oxygen atmosphere and an atmosphere including an oxygen gas and a chlorine-containing gas.

19. The method of claim 14, wherein the gate structure has a gate oxide film pattern, a polysilicon film pattern, and a metal silicide film pattern that are sequentially stacked.

* * * * *

UNITED STATES PATENT AND TRADEMARK OFFICE
CERTIFICATE OF CORRECTION

PATENT NO.      : 6,881,637 B2
APPLICATION NO. : 10/672884
DATED           : April 19, 2005
INVENTOR(S)     : Han et al.

It is certified that error appears in the above-identified patent and that said Letters Patent is hereby corrected as shown below:

At column 11, line 24, please replace "pattern. and" with --pattern, and--

Signed and Sealed this

Twelfth Day of September, 2006

JON W. DUDAS
*Director of the United States Patent and Trademark Office*